United States Patent [19]
Patterson et al.

[11] Patent Number: 5,218,235
[45] Date of Patent: Jun. 8, 1993

[54] POWER STEALING CIRCUIT

[75] Inventors: Christopher H. Patterson; Gary L. Miller, both of Santa Clara; Jeffrey A. Berkman, Saratoga, all of Calif.

[73] Assignee: Catalyst Semiconductor, Santa Clara, Calif.

[21] Appl. No.: 637,405

[22] Filed: Jan. 4, 1991

[51] Int. Cl.⁵ .......................................... H03K 5/153
[52] U.S. Cl. ................................. 307/39; 307/296.8; 307/359
[58] Field of Search ............... 340/310 A; 307/38, 39, 307/31, 11, 66, 85–87, 296.1, 296.3, 296.8, 355, 359, 106; 323/315

[56] References Cited

U.S. PATENT DOCUMENTS

| | | | |
|---|---|---|---|
| 4,245,319 | 1/1981 | Hedges | 307/38 |
| 4,360,739 | 11/1982 | Goldstein | 307/132 E |
| 4,372,675 | 2/1983 | Sahay | 355/77 |
| 4,494,244 | 1/1985 | Arndt et al. | 455/58.2 |
| 4,753,388 | 6/1988 | Rummage | 236/46 R |
| 4,776,514 | 10/1988 | Johnston et al. | 236/78 R |
| 5,034,626 | 7/1991 | Pirez et al. | 307/296.7 |

OTHER PUBLICATIONS

Paul R. Gray et al., "Analysis and Design of Analog Integrated Circuits", Second Edition, John Wiley & Sons, 1984, pp. 393–394, 734–735.

A. R. Alvarez (edited by), "BiCMOS Technology and Applications", Kluwer Academic Publishers, 1989, pp. 160–161.

Primary Examiner—A. D. Pellinen
Assistant Examiner—Richard Elms
Attorney, Agent, or Firm—Skjerven, Morrill, MacPherson, Franklin & Friel

[57] ABSTRACT

Power stealing circuit receives data signals on its signal input terminal and diverts some power from the signal input terminal to its power output terminal to power another circuit. When the voltage on the signal input terminal exceeds the voltage on the power output terminal, positive supply power is "stolen" from the signal input terminal to the power output terminal. When the signal input terminal is below the power output terminal, the two terminals are disconnected. A similar circuit "steals" negative supply power. In some embodiments, a comparator compares the voltages on the two terminals and regulates the power stealing operation.

19 Claims, 15 Drawing Sheets

POWER STEALING CIRCUIT

BACKGROUND OF THE INVENTION

1. Field of the Invention

This invention relates to electric devices, and more particularly to power stealing circuits.

2. Description of Related Art

FIG. 1 shows a block diagram of electric device 40 for processing data signals received on signal input terminal 42. Device 40 is powered by power supply 44 providing a supply voltage on power input terminal 46 of device 40.

In some applications, it is inconvenient to power a device by a separate power supply. Such applications are provided with a power stealing circuit as shown in FIG. 2. Power stealing circuit 50 receives data signals on its signal input terminal 52 and provides them on its signal output terminal 54 which is coupled to signal input terminal 42 of device 40. Power stealing circuit 50 diverts (or "steals") some power from the data signals and provides that power on its power output terminal 60. Power output terminal 60 is coupled to power input terminal 46 of device 40. The application of FIG. 2 does not have a separate power supply, but device 40 is powered by the power "stolen" from signal input terminal 52.

FIG. 3 shows a block diagram of a system using the scheme of FIG. 2. Computer 66 sends data signals to device 68 via cable 70. Computer 66 has connector 72 which mates with connector 74 of cable 70. Connector 72 can thus be coupled directly to connector 74. It is sometimes desirable, however, to perform additional processing of the data signals from computer 66 to device 68. Interconnecting device 80 is plugged between computer 66 and cable 70. Connector 82 of interconnecting device 80 mates with connector 72 of computer 66 and connector 84 of interconnecting device 80 mates with connector 74 of cable 70. Interconnecting device 80 receives data signals on the leads (not shown) of connector 72, processes the signals and supplies them to the leads (not shown) of connector 74. Interconnecting device 80 does not have its own power supply, but is powered by the power "stolen" from the data signal on the leads of connector 72.

FIG. 4 shows a block diagram of interconnecting device 80. Leads 90a, 90b, 90c and others (not shown) from connector 82 are coupled to signal input terminals of respective power stealing circuits 94a, 94b, 94c. Signal output terminals 96a through 96c of respective power stealing circuits 94a through 94c are coupled to processing device 98. Power output terminals 100a-100c of respective power stealing circuits 94 are coupled to power input terminal 102 of processing device 98. Processing device 98 processes the input signals as required and provides them on its respective output terminals 104a-104c coupled to connector 84.

FIG. 5 shows a circuit diagram of prior art power stealing circuit 110. Signal input terminal 52 is coupled to signal output terminal 54 and to the anode of diode 116. The cathode of diode 116 is coupled to power output terminal 60. Reservoir capacitor 120 is coupled between power output terminal 60 and reference terminal 121 coupled to ground. The cathode of diode 122 is coupled to signal input terminal 52, and the anode is coupled to reference terminal 121.

When the voltage on signal input terminal 52 exceeds the voltage VDD on power output terminal 60 by a p-n junction barrier potential of diode 116 (about 0.6 V for silicon diodes), diode 116 conducts. Current flows through diode 116 to power output terminal 60 and charges reservoir capacitor 120.

When the voltage on signal input terminal 52 goes below the voltage on power output terminal 60, diode 116 does not conduct preventing the loss of current from power output terminal 60 to signal input terminal 52. Reservoir capacitor 120, which stores the charge, discharges providing, for a while, power on power output terminal 60.

Diode 122 protects power stealing circuit 110 and the circuit (not shown) connected to terminals 54 and 60 from noise such as negative spikes on signal input terminal 52. When the voltage on signal input terminal 52 goes below ground far enough to forward bias diode 122, current flows from ground to signal input terminal 52.

An object of the present invention is to provide an efficient power stealing circuit for generating a supply voltage from a source of data signals.

SUMMARY OF THE INVENTION

The invention provides an efficient power stealing circuit. The invention allows to reduce the drop out voltage defined as the lowest voltage drop from the signal input terminal to the power output terminal at which the circuit "steals" power. For example, power stealing circuit 110 "steals" power when the voltage on signal input terminal 52 exceeds the voltage on power output terminal 60 by a p-n junction barrier potential of diode 116. Thus, the drop out voltage of power stealing circuit 110 is equal to the p-n junction barrier potential of diode 116, about 0.6 V for silicon diodes. The invention allows to reduce the drop out voltage to about 0 V. A low drop out voltage is particularly advantageous for "stealing" power from TTL level signals which have a high level of only about 2.4 V.

The power stealing circuit has a signal input terminal for receiving data signals and a power output terminal for providing a supply voltage. A switch selectively couples the signal input terminal and the power output terminal. A comparator has one input terminal coupled to the signal input terminal and another input terminal coupled to the power output terminal. The comparator controls the switch in response to the voltages on the comparator input terminals. In one embodiment, the switch is a transistor. When the voltage on the signal input terminal is above the voltage on the power output terminal, the comparator turns the transistor on allowing current to flow from the signal input terminal to the power output terminal.

According to another aspect of the invention, the power stealing circuit comprises a transistor having first and second electrodes defining the ends of its main current carrying path and a control electrode whose potential relative to said first electrode determines the conductivity of the transistor. The control electrode is coupled to the second electrode and to either the signal input terminal or the power output terminal. The first electrode of the transistor is coupled to the other one of the signal input terminal and the power output terminal. In one embodiment, the transistor is a MOS transistor having a threshold voltage of about 0 V.

Other advantages and features of the invention will become apparent from the following description and the appended claims.

DESCRIPTION OF THE PREFERRED EMBODIMENTS

Figure 6:
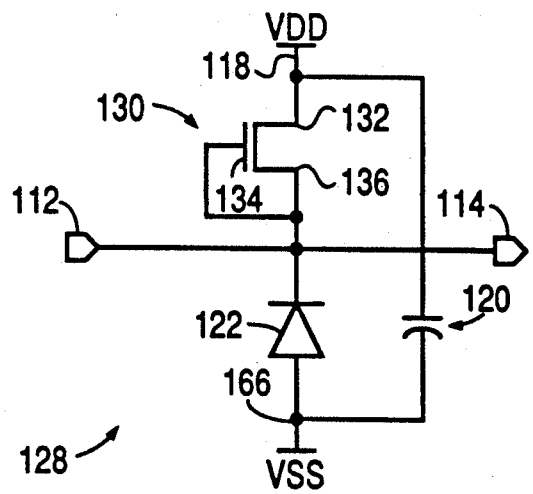
FIGS. 6, 7 and 8 show circuit diagrams of power stealing circuits according to this invention.

FIG. 6 shows a circuit diagram of power stealing circuit 128. Signal input terminal 112 is coupled to signal output terminal 114 and to drain 136 and gate 134 of n-channel transistor 130. Source 132 of transistor 130 is coupled to power output terminal 118. Reservoir capacitor 120 is coupled between power output terminal 118 and reference terminal 166 which is coupled to a low voltage VSS, typically ground. The cathode of diode 122 is coupled to signal input terminal 112, and the anode is coupled to reference terminal 166.

Transistor 130 conducts when the voltage on its gate 134 exceeds the voltage on its source 132 by at least the threshold voltage of transistor 130, that is when the voltage on signal input terminal 112 exceeds the voltage on power output terminal 118 by at least the threshold voltage. Thus the drop out voltage of power stealing circuit 128 equals the threshold voltage of transistor 130. In order to "steal" more power and provide the highest possible power output voltage, the drop out voltage should be as close to zero as possible. To that end, transistor 130 has a threshold voltage of 0 V or slightly above 0 V. If, however, due to process or temperature variations, the threshold voltage falls below 0 V, transistor 130 will conduct when signal input terminal 112 is below power output terminal 118, thus leading to loss of power on power output terminal 118 and to discharge of reservoir capacitor 120.

In one variation, transistor 130 is a p-channel transistor having a source connected to signal input terminal 112 and having a gate and a drain both connected to power output terminal 118.

Figure 7:
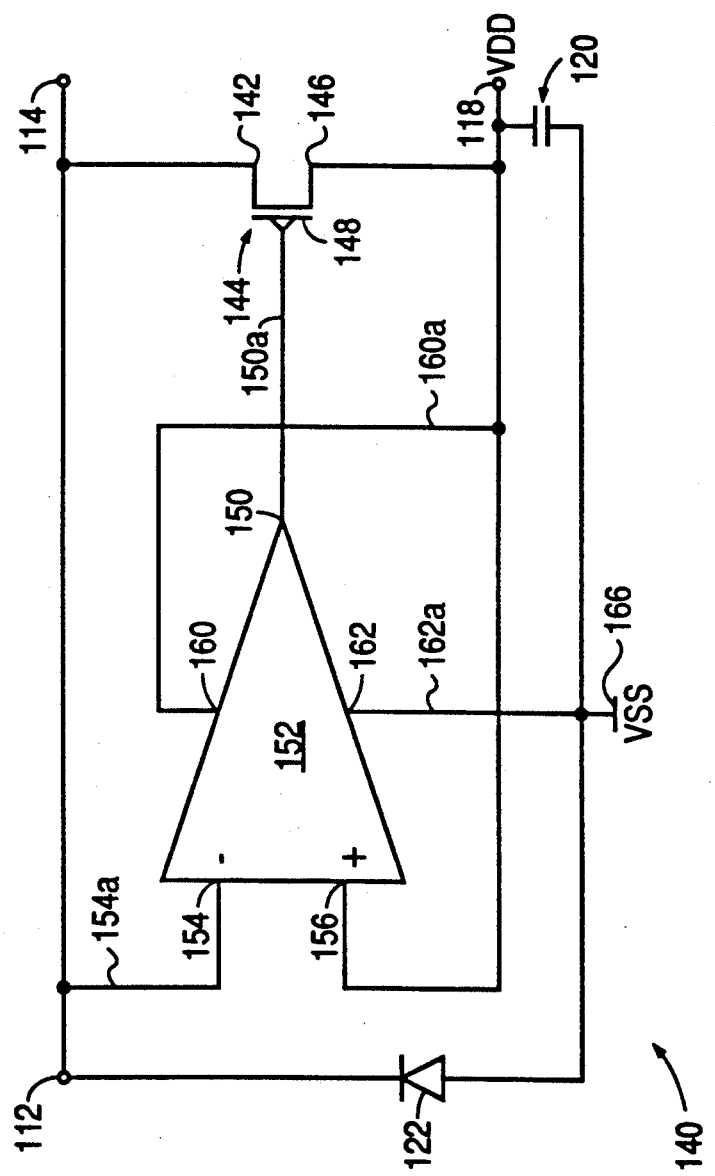

FIG. 7 shows a circuit diagram of power stealing circuit 140. Signal input terminal 112 is coupled to signal output terminal 114 and to source 142 of p-channel transistor 144. Drain 146 of transistor 144 is coupled to power output terminal 118, and gate 148 is coupled to output terminal 150 of comparator 152 by lead 150a. Transistor 144 has a threshold voltage of about −0.7 V. Inverting input terminal 154 of comparator 152 is coupled to signal input terminal 112 by lead 154a, and non-inverting input terminal 156 is coupled to power output terminal 118. Positive voltage supply terminal 160 of comparator 152 is coupled to power output terminal 118 via lead 160a, and negative voltage supply terminal 162 of comparator 152 is coupled via lead 162a to reference terminal 166 which is coupled to a low voltage VSS, typically ground. Reservoir capacitor 120 is coupled between power output terminal 118 and reference terminal 166. The cathode of diode 122 is coupled to signal input terminal 112, and the anode is coupled to reference terminal 166.

Data signals are received on signal input terminal 112 and provided on signal output terminal 114. Data signals typically have a voltage between VSS and some higher value. When the voltage on signal input terminal 112 exceeds voltage VDD on power output terminal 118, the voltage on inverting input terminal 154 of comparator 152 exceeds voltage VDD on non-inverting input terminal 156. The voltage on output terminal 150 goes down to the low rail value equal to the voltage on negative voltage supply terminal 162, that is to VSS. Thus the voltage on gate 148 of transistor 144 is VSS, the voltage on source 142 equals the voltage on signal input terminal 112, and the voltage on drain 146 equals the voltage of power output terminal 118. If the gate-source voltage of transistor 144 is below the threshold voltage of −0.7 V, transistor 144 conducts, and current flows from signal input terminal 112 to power output terminal 118, thereby increasing power output voltage VDD and charging reservoir capacitor 120.

When the voltage on signal input terminal 112 is below the voltage on power output terminal 118, the voltage on inverting input terminal 154 of comparator 152 is below the voltage on non-inverting input terminal 156. The voltage on output terminal 150 goes up to the high rail value of positive voltage supply terminal 160, that is to VDD. Thus the voltage on gate 148 of transistor 144 is VDD, the voltage on drain 146 is also VDD, and the voltage on source 142 equals the voltage on signal input terminal 112 which is below VDD. Transistor 144 turns off, thereby blocking the loss of current from power output terminal 118 to signal input terminal 112. Reservoir capacitor 120, which stores the charge, discharges providing, for a while, power on power output terminal 118.

Power stealing circuit 140 "steals" power when the voltage on signal input terminal 112 exceeds VDD, and when it exceeds VSS by the threshold voltage of transistor 144 (0.7 V). Typically power output terminal 118 is coupled to more than one power stealing circuit in the manner of FIG. 4. Typically, when the power stealing circuits have been operating for even a short while, voltage VDD on output terminal 118 is above 0.7 V. Then, if VSS is 0 V, each power stealing circuit 140 "steals" power as long as the voltage on its signal input terminal 112 exceeds VDD. The drop out voltage is then near 0 V.

In one variation, comparator 152 has a slight offset voltage. This offset voltage provides a known output state of comparator 152 for equal input voltages on terminals 154 and 156. A detailed description of the internal components (and their sizes) of comparator 152 is provided below in the explanation of FIG. 11. Output terminal 150 swings from the high rail to the low rail when inverting input terminal 154 is below non-inverting input terminal 156 by the amount of the offset voltage. Thus when the voltage on signal input terminal 112 equals the voltage on power output terminal 118, output terminal 150 of comparator 152 is at the low rail and transistor 144 is on. This is done to achieve a faster turn-on of transistor 144 as the voltage on signal input terminal 112 increases to and beyond the voltage on power output terminal 118. While transistor 144 turns on faster, it turns off slower when the voltage on signal input terminal 112 goes down, and some power can even be lost while signal input terminal 112 goes below power output terminal 118 by the amount of offset voltage. This power loss is insignificant, and its disadvantage is minimized by providing the maximum power "stealing" which is due to fast turn-on of transistor 144.

Figure 8:
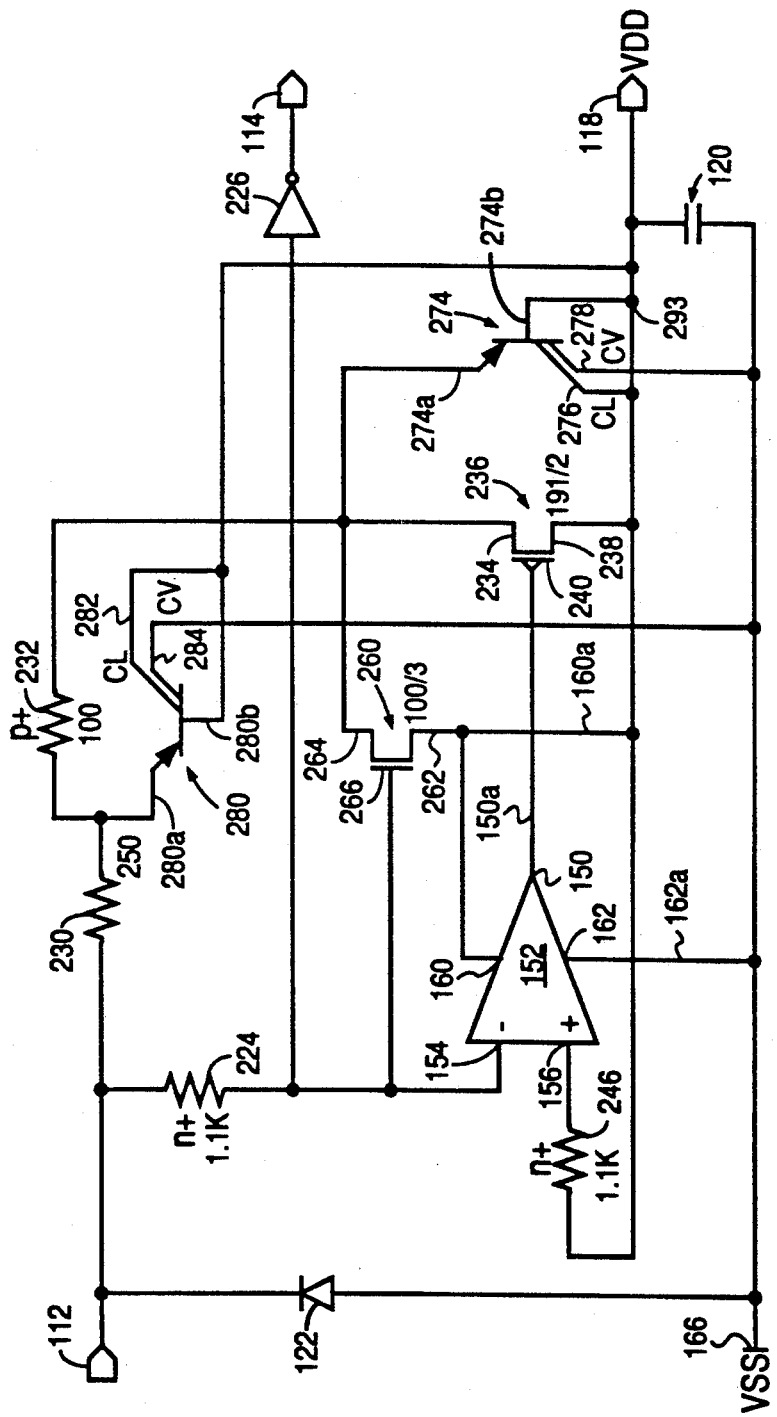

FIG. 8 shows a circuit diagram of power stealing circuit 220 constructed in accordance with the present invention, which includes a combination of the power stealing circuits of FIGS. 6 and 7. Signal input terminal 112 is coupled through resistor 224 and invertor 226 to signal output terminal 114. Signal input terminal 112 is coupled through resistors 230 and 232 to source 234 of p-channel transistor 236 whose drain 238 is coupled to power output terminal 118. Gate 240 of transistor 236 is coupled to output terminal 150 of comparator 152 via lead 150a. Inverting input terminal 154 of comparator 152 is coupled through resistor 224 to signal input terminal 112. Non-inverting input terminal 156 is coupled through resistor 246 to power output terminal 118. Positive voltage supply terminal 160 of comparator 152 is coupled to power output terminal 118 via lead 160a, and negative voltage supply terminal 162 is coupled via lead 162a to reference terminal 166 which is coupled to a low voltage VSS, typically ground. Reservoir capacitor 120 is coupled between power output terminal 118 and reference terminal 166. N-channel transistor 260 has source 262 coupled to power output terminal 118, drain 264 coupled to signal input terminal 112 through resistors 232 and 230, and gate 266 coupled to signal input terminal 112 through resistor 224. Diode 122 has its cathode coupled to signal input terminal 112 and its anode coupled to reference terminal 166.

Figure 11:
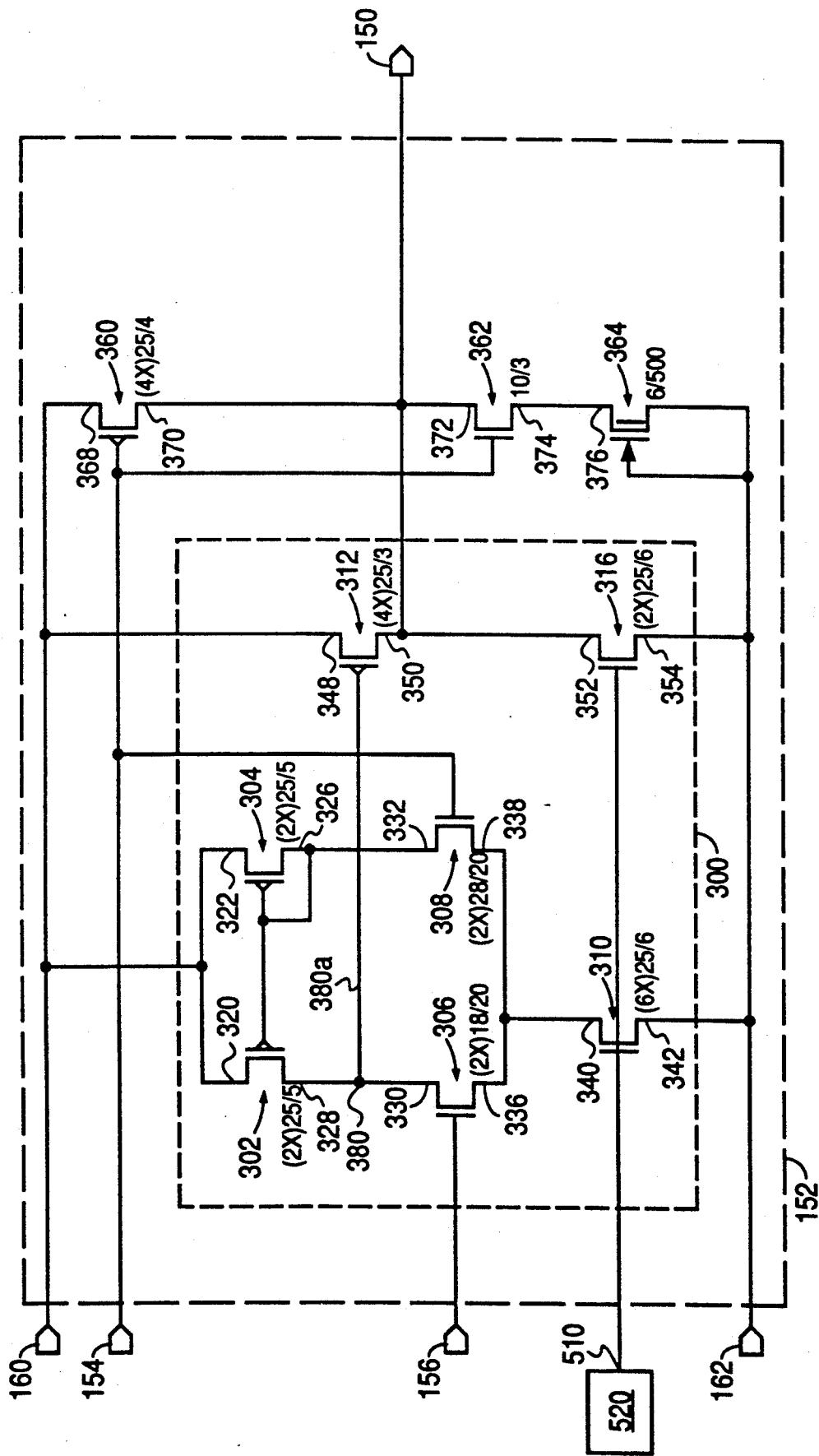
FIG. 11 shows a circuit diagram of the comparator used in the circuit of FIG. 8.

Power stealing circuit 220 further includes a parasitic p-n-p bipolar transistor 274 having its emitter 274a coupled to source 234 of transistor 236, its base 274b coupled to power output terminal 118, and two collectors: lateral collector ("CL"), indicated by reference character 276, coupled to power output terminal 118, and vertical collector ("CV"), indicated by reference character 278, coupled to reference terminal 166. Power stealing circuit 220 also includes a parasitic p-n-p bipolar transistor 280 having its emitter 280a coupled to signal input terminal 112 through resistor 230, its base 280b coupled to power output terminal 118, and two collectors: lateral collector ("CL"), indicated by reference character 282, coupled to power output terminal 118, and vertical collector ("CV"), indicated by reference character 284, coupled to reference terminal 166. The voltage on signal input terminal 112 varies between a low value of about −0.7 V below VSS (or higher) and a higher value. The part of power stealing circuit 220 which includes comparator 152 and transistor 236 operates much like power stealing circuit 140 of FIG. 7. The threshold voltage of transistor 236 is −0.7 V. In some comparator embodiments such as the embodiment described below in connection with FIG. 11, comparator 152 draws no current at either its inverting input terminal 154 or its non-inverting input terminal 156. When the data signal on signal input terminal 112 is of a higher voltage than voltage VDD on power output terminal 118, transistor 236 turns on, and current flows from signal input terminal 112 to power output terminal 118 through resistors 230 and 232 and transistor 236. When the voltage on signal input terminal 112 is below the voltage on power output terminal 118, transistor 236 turns off blocking the loss of current from power output terminal 118. Comparator 152 is provided with a slight offset voltage in order to make transistor 236 turn on faster as explained above in connection with power stealing circuit 140 of FIG. 7, and in order to avoid oscillation when signal input terminal 112 and power output terminal 118 are at nearly the same voltage, that is when little current is being used from power output terminal 118. The drop out voltage of this part of power stealing circuit 220 is near 0 V.

As is indicated in FIG. 8, transistor 236 has a channel width/length dimension of 191μm/2μm. Transistor 236 has fast turn on characteristics and large current handling capability. Resistor 224 is 1.1K ohms, resistor 230 is 250 ohms, resistor 232 is 100 ohms, and resistor 246 is 1.1K ohms as is indicated in FIG. 8.

N-channel transistor 260 provides another electrical path from signal input terminal 112 to power output terminal 118 in a manner similar to that of transistor 130 of power stealing circuit 128 of FIG. 6. When the voltage on gate 266, which is coupled to signal input terminal 112, exceeds the voltage on source 262 by at least the threshold voltage of transistor 260 (about 0.7 V), current flows from signal input terminal 112 through resistors 230 and 232 and transistor 260 to power output terminal 118.

Transistor 260 is a relatively large transistor, having a channel width/length dimension of 100μm/3μm. Transistor 260 requires, for turning on, a higher difference between the voltages on signal input terminal 112 and power output terminal 118 than transistor 236. When both transistors 260 and 236 are on, large current flows through them from signal input terminal 112 to power output terminal 118 charging up reservoir capacitor 120. As the voltage on signal input terminal 112 goes down approaching the voltage on power output terminal 118, transistor 260 starts shutting off, thus increasing the impedance of the electrical path between signal input terminal 112 and power output terminal 118. Initially, when power stealing circuit 220 is just switched into operation ("at time 0"), the voltages at all points in power stealing circuit 220 are 0 V. It might take time for different parts of comparator 152 to charge so as to provide a proper signal on output terminal 150. During that time, transistor 260 provides proper power stealing operation.

Resistors 224, 230, 232 and 246 protect power stealing circuit 220 and the circuit (not shown) coupled to power output terminal 118 from noise on signal input terminal 112.

Figure 5:
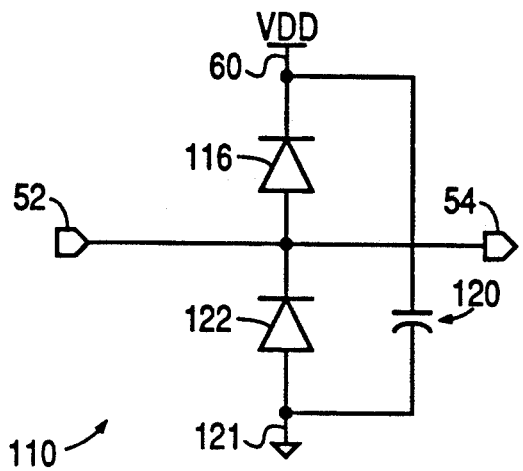
FIG. 5 shows a circuit diagram of a prior art power stealing circuit.

Diode 122 serves to protect power stealing circuit 220 and the circuit coupled to power output terminal 118 from negative voltage noise as described above in connection with power stealing circuit 110 of FIG. 5.

Figure 9:
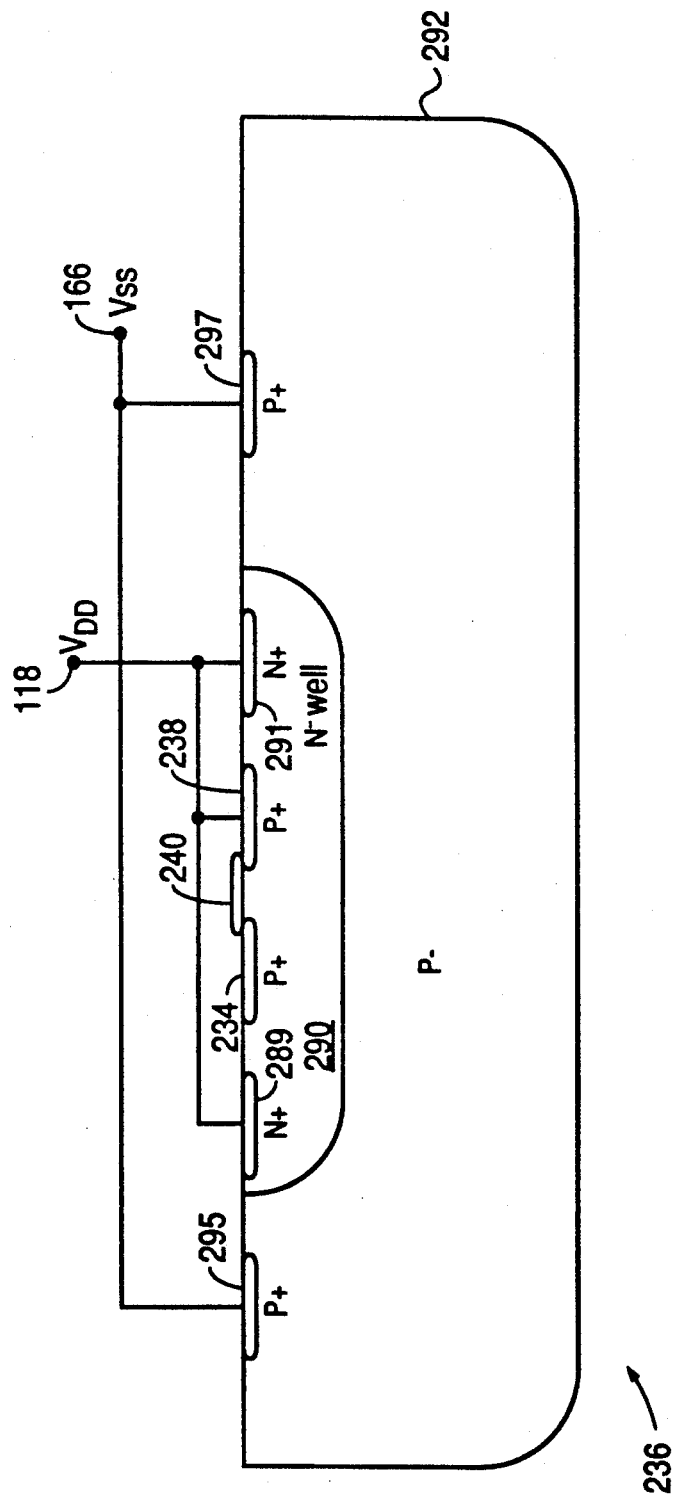
FIG. 9 shows a combination cross-section and electrical connections of a semiconductor device used in the circuit of FIG. 8.

Parasitic transistor 274 is formed as a result of the structure of transistor 236. FIG. 9 shows a combination cross-section and electrical connections of transistor 236 4 and drain region 238 are formed in n-well 290 on p-substrate 292. Source region 234 serves as emitter 274a of transistor 274, and drain 238 serves as lateral collector 276. N-well 290 serves as base 274b. N-well 290 is connected to power output terminal 118 through N+ diffusion regions 289 and 291. P-substrate 292 serves as vertical collector 278. P+ diffusion regions 295 and 297 in substrate 292 are connected to reference terminal 166. Diffusion regions 295 and 297 are proximate to well 290. Drain 238 and n-well 290 are coupled to node 293 which is coupled to power output terminal 118.

When the voltage drop from signal input terminal 112 to power output terminal 118 is high enough to forward bias the p-n junction between source 234 and n-well 290, parasitic transistor 274 turns on, and current is injected into n-well 290. Some current is collected by power output terminal 118, thus increasing the effectiveness of power stealing circuit 220. Some current flows into p-substrate 292. This current then flows into reference terminal 166 through nearby diffusion regions 295 and 297, thus decreasing the probability of a latch up.

Figure 10:
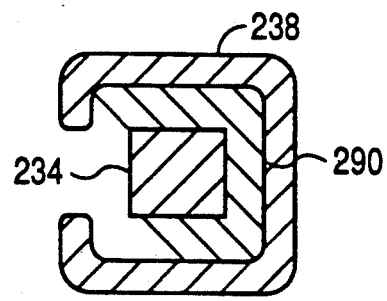
FIG. 10 shows a layout representation of a portion of a transistor shown in FIGS. 8 and 9.

FIG. 10 shows a plan view of one of eight structures used to construct transistor 236. A portion of source/emitter 234 is partially surrounded by a portion of drain 238. This structure increases the amount of current collected by drain 238/lateral collector 276, and thus it increases the power stealing effectiveness of power stealing circuit 220. Transistor 236 has seven other structures such as the structure of FIG. 10. The source portions of all the structures are interconnected by a metal interconnect. The drain portions are also interconnected by a metal interconnect.

Resistor 232 (FIG. 8) is formed by a p+ doped silicon line which is located above a substrate and within an n-well and which also serves as an emitter of parasitic transistor 280. An n+ doped interconnect line (positioned above the substrate and within the same n-well) serves as a base contact of transistor 280. Two p+ doped interconnect lines serve respectively as lateral collector 282 and a contact to vertical collector 284. When the voltage on signal input terminal 112 increases sufficiently to forward bias the emitter-base junction of transistor 280, transistor 280 turns on. Some current is collected by lateral collector 282 and base 280b and flows to power output terminal 118 thus enhancing the effectiveness of power stealing circuit 220. Some current is collected by vertical collector 284 and flows to reference terminal 166 through nearby substrate diffusion connections, thereby minimizing the probability of a latch up.

FIG. 11 shows a circuit diagram of comparator 152. Comparator 152 includes comparator subcircuit 300 comprising transistors 302, 304, 306, 308, 310, 312 and 316. Sources 320 and 322 of respective p-channel transistors 302 and 304 are coupled to positive voltage supply terminal 160, which in turn is coupled to power output terminal 118 (see FIG. 8). The gates of transistors 302 and 304 are coupled to each other and to drain 326 of transistor 304. Drains 328 and 326 of respective transistors 302 and 304 are coupled respectively to drains 330 and 332 of respective n-channel transistors 306 and 308. The gate of transistor 306 is coupled to non-inverting input terminal 156 which serves as the non-inverting terminal of comparator subcircuit 300. The gate of transistor 308 is coupled to inverting input terminal 154 which serves as the inverting terminal of comparator subcircuit 300. Sources 336 and 338 of respective transistors 306 and 308 are coupled to drain 340 of n-channel transistor 310 whose source 342 is coupled to negative Voltage supply terminal 162. The gate of transistor 310 is coupled to terminal 510 of bias generator circuit 520. Bias generator circuit 520 fully described below provides a voltage on terminal 510 so as to provide an approximately constant, temperature independent current through transistor 310.

P-channel transistor 312 and n-channel transistor 316 form an invertor, inverting the signal on drain 328 of transistor 302 and providing the inverted signal on output terminal 150 which serves as the output terminal of comparator subcircuit 300. Drain 328 of transistor 302 is coupled (via node 380 and lead 380a) to the gate of transistor 312. Source 348 of transistor 312 is coupled to positive voltage supply terminal 160 of comparator 152. Drain 350 of transistor 312 is coupled to output terminal 150 and to drain 352 of transistor 316. Source 354 of transistor 316 is coupled to negative voltage supply terminal 162. The gate of transistor 316 is coupled to terminal 510. The voltage on terminal 510 serves to provide an approximately constant, temperature independent current through transistor 316.

P-channel transistor 360, n-channel transistor 362, and a depletion n-channel transistor 364 form an invertor, inverting signals received on inverting input terminal 154 and providing the inverted signals on output terminal 150. Source 368 of transistor 360 is coupled to positive voltage supply terminal 160 of comparator 152. The gate of transistor 360 is coupled to inverting input terminal 154 and to the gate of transistor 362. Drain 370 of transistor 360 is coupled to output terminal 150 and to drain 372 of transistor 362. Source 374 of transistor 362 is coupled to drain 376 of transistor 364 whose gate and source are coupled to negative voltage supply terminal 162.

When the voltage on inverting input terminal 154 exceeds the voltage on non-inverting input terminal 156, transistor 308 conducts more current than transistor 306. Consequently, node 380 at drain 328 of transistor 302 is pulled up. Transistor 312 turns off, and output terminal 150 is pulled down to VSS through transistor 316 and negative voltage supply terminal 162 (which is coupled to reference terminal 166 as illustrated in FIG. 8).

When the voltage on non-inverting input terminal 156 exceeds the voltage on inverting input terminal 154, transistor 306 conducts more current than transistor 308. Node 380 is pulled down, turning on transistor 312. Drain 350 of transistor 312 is pulled up by voltage VDD on positive voltage supply terminal 160 and accordingly the voltage on output terminal 150 goes up to VDD.

Transistors 360, 362 and 364 also control the voltage on output terminal 150. The threshold voltage of transistor 360 is about −0.7 V. When the voltage on inverting input terminal 154 (which is, as illustrated in FIG. 8, coupled to signal input terminal 112) is higher than voltage VDD on positive voltage supply terminal 160, transistor 360 is off. Output terminal 150 is accordingly pulled down through transistors 362 and 364 by voltage VSS which is coupled to terminal 162. When the voltage on inverting input terminal 154 goes down 0.7 V below voltage VDD on positive voltage supply terminal 160, transistor 360 turns on and output terminal 150 is pulled up.

At time 0, when power stealing circuit 220 is just switched into operation, transistors 360, 362 and 364 serve to provide a fast start-up of comparator 152 while bias generator circuit 520 is charging up so as to provide a proper voltage on terminal 510.

As indicated by the notation (2×)25/5 adjacent to transistor 302 in FIG. 11, the channel of transistor 302 has two portions, each having a width/length dimension of 25μm/5μm. The width/length dimension of the entire channel of transistor 302 is thus 50μm/5μm. The channel of transistor 304 is of the same size. Also, as indicated portions, each having a width/length dimension of 18μm/20μm. It will also be noted from FIG. 11 that the channel of transistor 308 has two portions, each having a width/length dimension of 28μm/20μm. The channel of transistor 310 has six portions, each having a width/length dimension of 25μm/6μm. The channel of transistor 312 has four portions, each having a width/length dimension of 25μm/3μm. The channel of transistor 316 has two portions, each having a width/length dimension of 25μm/6μm. The channel of transistor 360 has four portions, each having a width/length dimension of 25μm/4μm. Transistor 362 has a channel width/length dimension of 10μm/3μm. Transistor 364 has a channel width/length dimension of 6μm/500μm.

As is seen from the channel width/length parameters, transistor 308 is larger than transistor 306. As a result, comparator 152 has a slight offset voltage. When the voltage on inverting input terminal 154 equals the voltage on non-inverting input terminal 156, transistor 308 conducts more current than transistor 306, resulting in node 380 being high and output terminal 150 being low. Node 380 is pulled down only after the voltage on inverting input terminal 154 goes below the voltage on non-inverting input terminal 156 by a predetermined amount which is sufficient to make transistor 308 conduct less current than transistor 306.

As is seen from the channel size parameters, transistors 302, 304, 306 and 308 are fairly small. Current provided by transistor 310 is small. Comparator subcircuit 300 is thus slow. Its advantage is that it draws little current. Transistor 360 is relatively large. It is fast, and it provides a fast turn-off of power stealing circuit 220 when the voltage on signal input terminal 112 goes down 0.7 V or more below voltage VDD, that is when a power loss from power output terminal 118 could be potentially high. On the whole, comparator 152 is fast in providing a high voltage on output terminal 150, and it draws little current.

Figure 12:
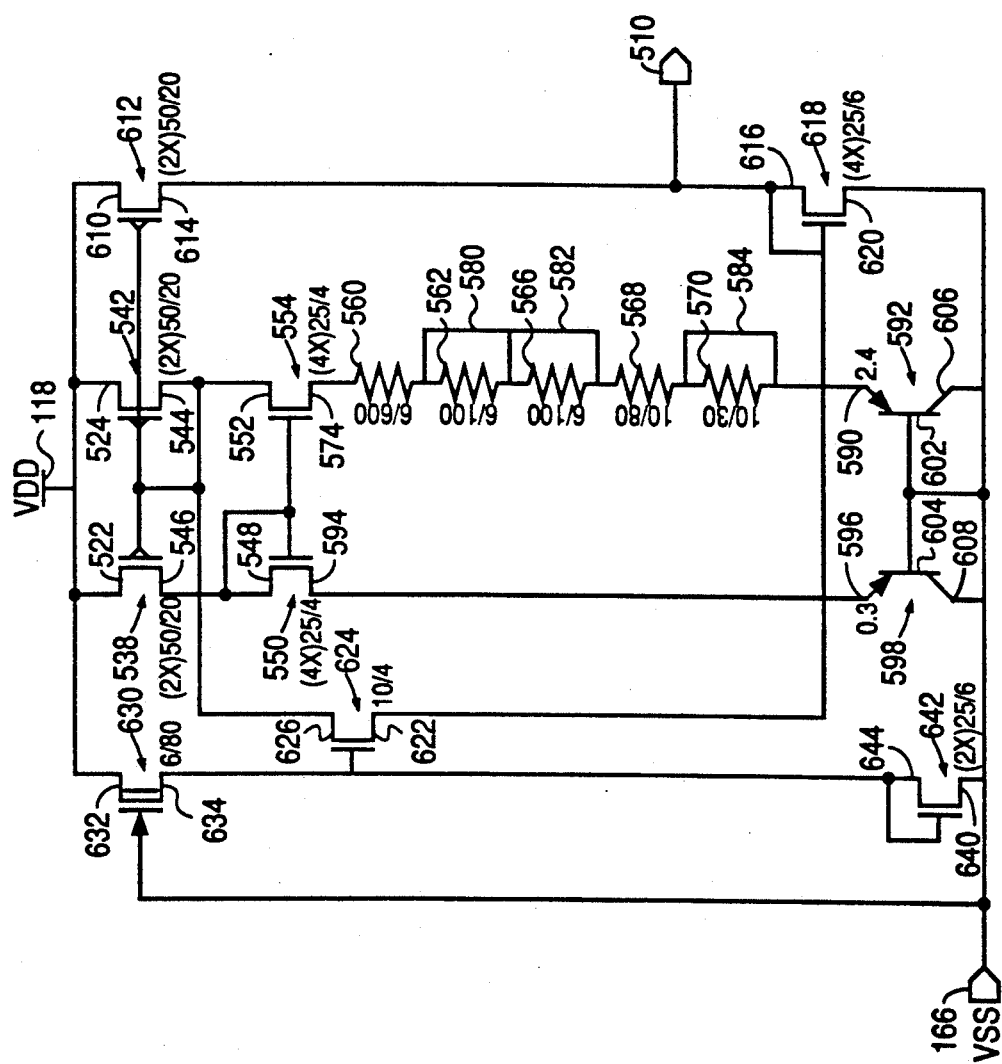
FIG. 12 shows a circuit diagram of a bias generator circuit used in the comparator of FIG. 11.

FIG. 12 shows a circuit diagram of bias generator circuit 520. Power output terminal 118 is coupled to sources 522 and 524 of respective p-channel transistors 538 and 542, transistors 538 and 542 each having a channel width/length dimension of (2×)50μm/20μm. The gates of transistors 538 and 542 are coupled to each other and to drain 544 of transistor 542. Drain 546 of transistor 538 is coupled to drain 548 of n-channel transistor 550. Drain 544 of transistor 542 is coupled to drain 552 of n-channel transistor 554. Transistors 550 and 554 each have a channel width/length dimension of (4×)25μm/4μm. The gates of transistors 550 and 554 are coupled to each other and to drain 548 of transistor 550. N-type resistors 560, 562, 566, 568 and 570 are connected in series to source 574 of transistor 554. Resistor 560 has six segments in series, each segment having a width/length dimension of 6μm/100μm. Resistors 562 and 566 each have a width/length dimension of 6μm/100μm. Resistor 568 has two segments in series, each segment having a width/length dimension of 10μm/40μm. Resistor 570 has a width/length dimension of 10μm/30μm. Resistors 560, 562 and 566 are doped arsenic to a peak concentration of $1.2 \times 10^{19}$ atoms/cm$^3$. They have a junction depth of about 0.35μm, a sheet resistance of about 150 ohms/square, and a temperature coefficient (tempco) of about 690 ppm/° C. Resistors 568 and 570 are doped with phosphorous to a peak concentration of $2 \times 10^{16}$ atoms/cm$^3$. They have a junction depth of about 3.7μm, a sheet resistance of about 1850 ohms/square, and tempco of about 8600 ppm/° C. An optional jumper 580 shorts the terminals of resistors 562. An optional jumper 582 shorts the terminals of resistors 566. An optional jumper 584 shorts the terminals of resistor 570.

Resistors 560, 562, 566, 568 and 570 are coupled in series between source 574 of transistor 554 and emitter 590 of bipolar p-n-p transistor 592. Source 594 of transistor 550 is coupled to emitter 596 of bipolar p-n-p transistor 598. Base 602 of transistor 592, base 604 of transistor 598, collector 606 of transistor 592 and collector 608 of transistor 598 are coupled to each other and to reference terminal 166. Transistor 592 has an emitter-base diode area of about 576μm$^2$, and is comprised of eight individual devices, each having an emitter-base diode area of 6μm × 12μm. Transistor 598 has an emitter-base diode area of about 6μm × 12μm.

Source 610 of p-channel transistor 612 is coupled to power output terminal 118. The gate of transistor 612 is coupled to the gates of transistors 538 and 542. Drain 614 of transistor 612 is coupled to terminal 510, to drain 616 and to the gate of n-channel transistor 618. Transistor 612 has the same channel size as transistor 542. Transistor 618 has a channel width/length dimension of (4×)25μm/6μm. Source 620 of transistor 618 is coupled to reference terminal 166. Drain 616 and the gate of transistor 618 are coupled to each other and to source 622 of n-channel transistor 624 which has a channel width/length dimension of 10μm/4μm and a threshold voltage of about 0.7 V. Drain 626 of transistor 624 is coupled to the gates of transistors 538 and 542. Reference terminal 166 is coupled to the gate of n-channel depletion mode transistor 630 whose drain 632 is coupled to power output terminal 118 and whose source 634 is coupled to the gate of transistor 624. Transistor 630 has a channel width/length dimension of 6μm/180μm and a threshold voltage of about −2.3 V. Reference terminal 166 is coupled to source 640 of n-channel transistor 642 which has a channel width/length dimension of (2×)25μm/6μm and a threshold voltage of about 0.7 V. Drain 644 of transistor 642 is coupled the gate of transistor 642 and to the gate of transistor 624.

In layout, transistors 550 and 554 are a common centroid pair, transistors 538 and 542 are a common centroid pair, and transistors 592 and 598 are a common centroid pair. Common centroid layouts are described in Paul R. Gray and Robert G. Meyers, *Analysis and Design of Analog Integrated Circuits* (2d ed. 1984, John Wiley & Sons), pages 393–394, hereby incorporated by reference. Common centroid layouts reduce the dependence of the electrical characteristics of bias generator circuit 520 on temperature and process gradients.

Bias generator circuit 520 operates as follows. Since transistors 538 and 542 have the same size and the same gate to source voltage, currents through transistors 538 and 542 are approximately equal. Therefore, the emitter-base diode currents in transistors 598 and 592 are approximately equal. Since transistor 598 has the smaller emitter-base diode area, the emitter-base voltage drop of transistor 598 (Veb1) is larger than the emitter-base voltage drop of transistor 592 (Veb2). The difference Veb1 − Veb2 has a positive temperature coefficient (tempco).

Transistors 550 and 554 being of equal size and having equal currents will be forced to have identical gate to source voltages. Consequently, the voltage across resistors 560, 562, 566, 568 and 570 equals the difference Veb1 − Veb2. The semiconductor materials of resistors 560, 562, 566, 568 and 570 are chosen so that the tempco of the resistors about equals the tempco of Veb1 − Veb2. Thus the current through the resistors is temperature independent. See Paul R. Gray and Robert G. Meyer, supra, pages 734–735.

Resistors 560, 562, 566, 568 and 570 are chosen to be of two types of semiconductor material having different tempcos. This is convenient when available processes are hard to adapt to manufacturing a resistor with a tempco matching precisely the tempco of Veb1 − Veb2. Resistors with different tempcos are combined to achieve the tempco matching the tempco of the difference Veb1 − Veb2.

Transistor 612 has the same size and gate to source voltage as transistor 542. So the current through transistor 612 is about the same as through transistor 542. Transistor 618 has the same gate to source voltage as transistors 310 and 316 of FIG. 11. Thus the currents through transistors 618, 310 and 316 differ according the transistor sizes. The current through transistor 618 is the same as the current through transistor 612. The current through transistor 310 is 6/4 times the current through transistor 618. The current through transistor 316 is 2/4 times the current through transistor 618. The currents through transistors 310 and 316 are relatively independent of temperature and of voltage VDD on power output terminal 118.

Transistors 624, 630 and 642 act to start bias generator circuit 520. Right after time 0, voltage VDD is low. Depletion transistor 630 conducts, voltage at drain 644 of diode connected transistor 642 increases, and transistor 642 also conducts. When voltage at the gate of transistor 624 increases to the threshold voltage of transistor 624, transistor 624 turns on and draws current at the gates of transistors 538, 542 and 612. The voltage 0 at the gates of transistors 538, 542 and 612 is thereby lowered, and transistors 538, 542 and 612 turn on. Current then flows into transistors 550 and 554, and then into emitters 596 and 590 of respective bipolar transistors 598 and 592. Bias generator circuit 520 turns on. Current through transistor 612 increases the voltage at terminal 510 and, therefore, at source 622 of transistor 624. The gate to source voltage of transistor 624 decreases, and transistor 624 turns off. From that point on, current at terminal 510 is set by resistors 560, 562, 566, 568, and 570 and bipolar transistors 598 and 592 as described above.

Figure 1:
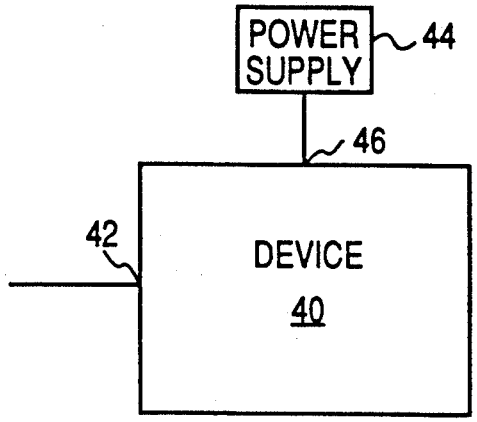
FIG. 1 shows a block diagram of an electric device using a power supply.
Figure 2:
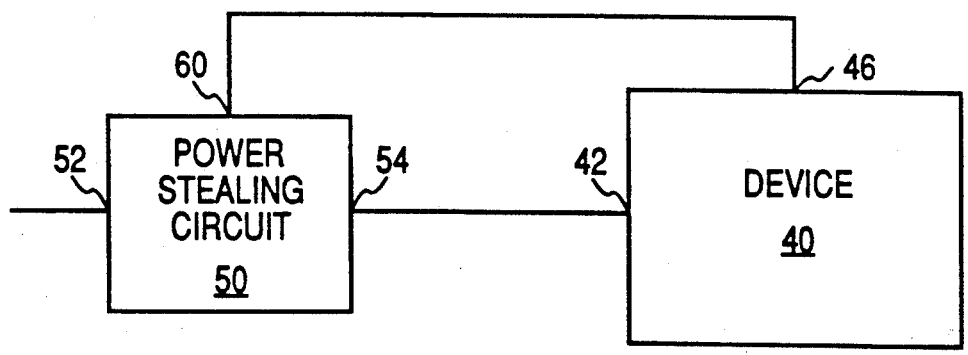
FIG. 2 shows a block diagram of a device with an associated power stealing circuit.
Figure 3:
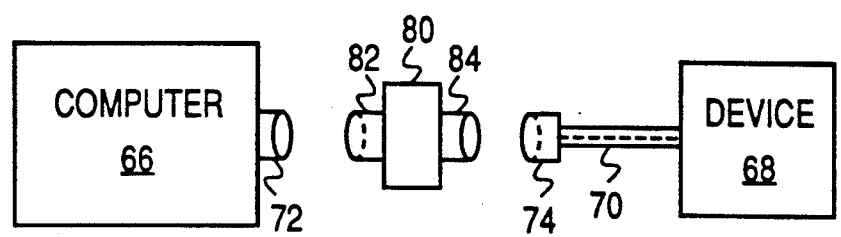
FIG. 3 shows a block diagram of a system using a power stealing circuit.
Figure 4:
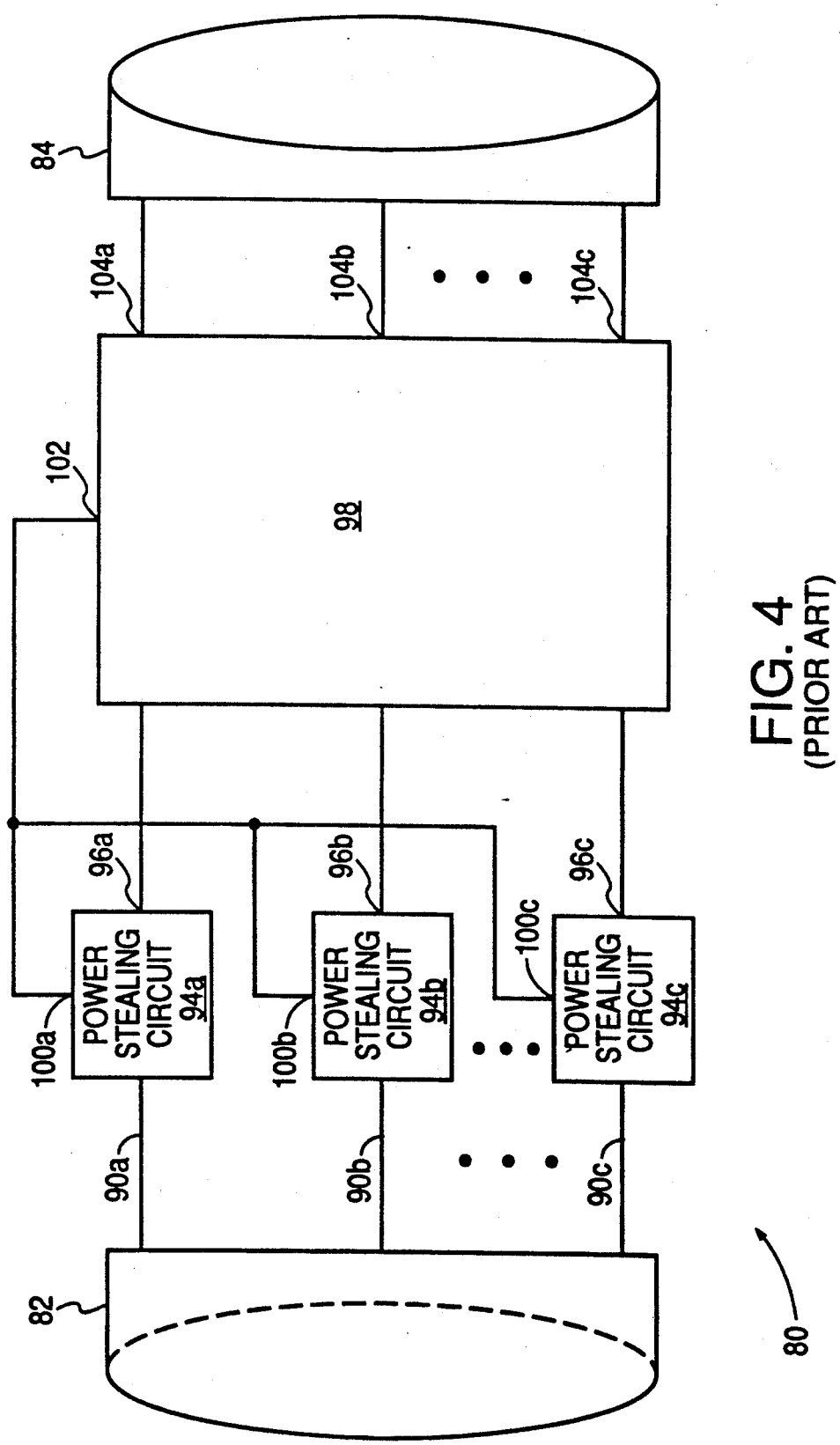
FIG. 4 shows a block diagram of a portion of the system of FIG. 3, which portion contains a power stealing circuit.
Figure 13:
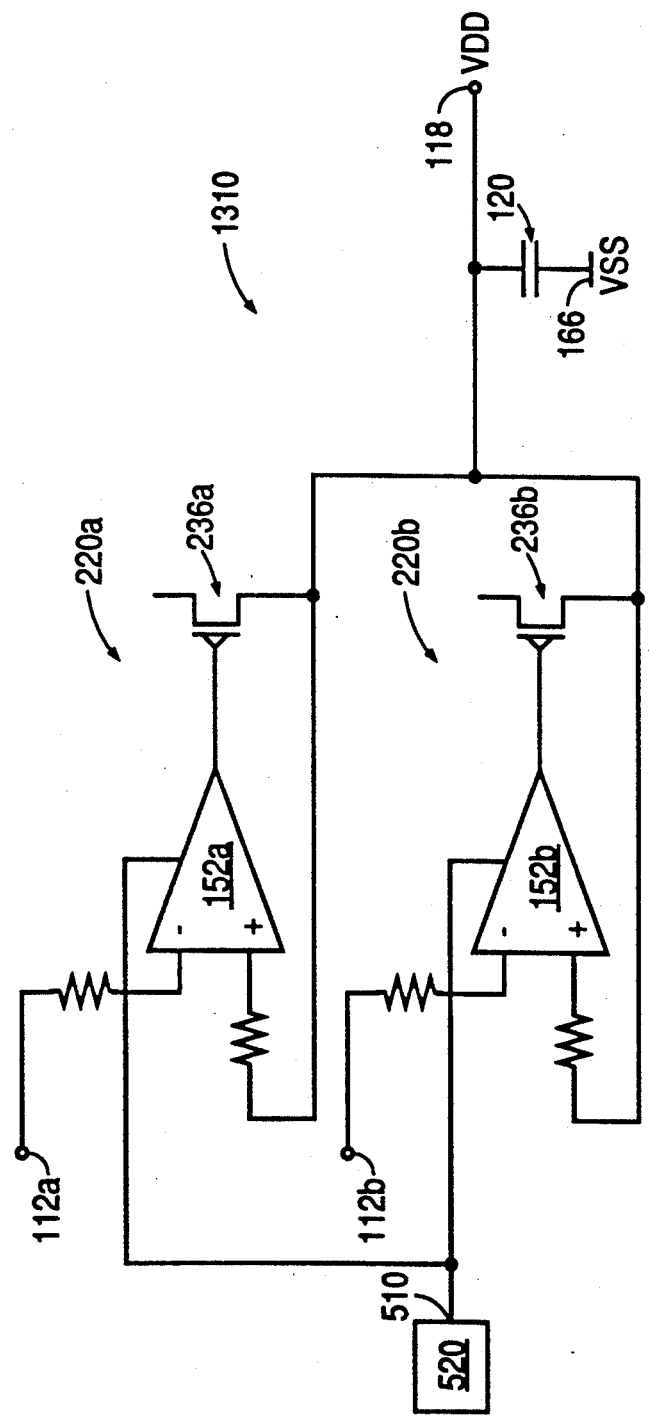
FIG. 13 shows a circuit diagram of a portion of a power stealing circuit according to this invention.

Two or more power stealing circuits like power stealing circuit 220 are combined in some embodiments in the manner of FIG. 4. FIG. 13 shows a portion of a circuit diagram of power stealing circuit 1310 which includes a combination of power stealing circuits 220a and 220b. Each of power stealing circuits 220a and 220b is similar to power stealing circuit 220 of FIG. 8. Power stealing circuits 220a and 220b "steal" power from respective signal input terminals 112a and 112b and provide the "stolen" power on the shared power output terminal 118. Power stealing circuits 220a and 220b share reservoir capacitor 120. Comparators 152a and 152b of respective power stealing circuits 220a and 220b share bias generator circuit 520.

Figure 14A:
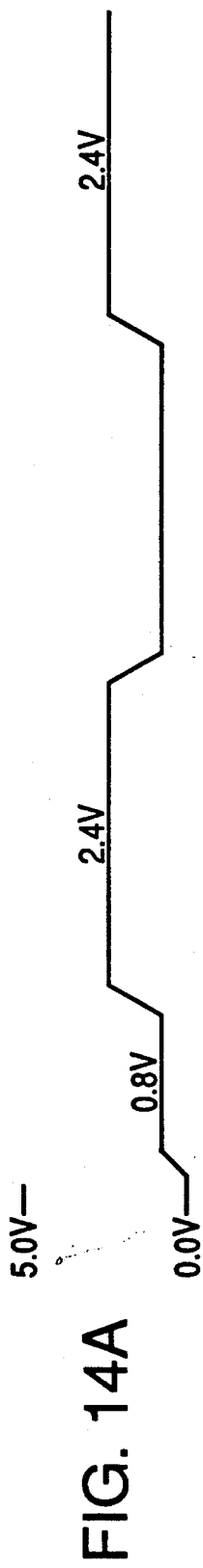
FIG. 14 shows diagrams of input signals and a power output signal of the circuit of FIG. 13.
Figure 14B:
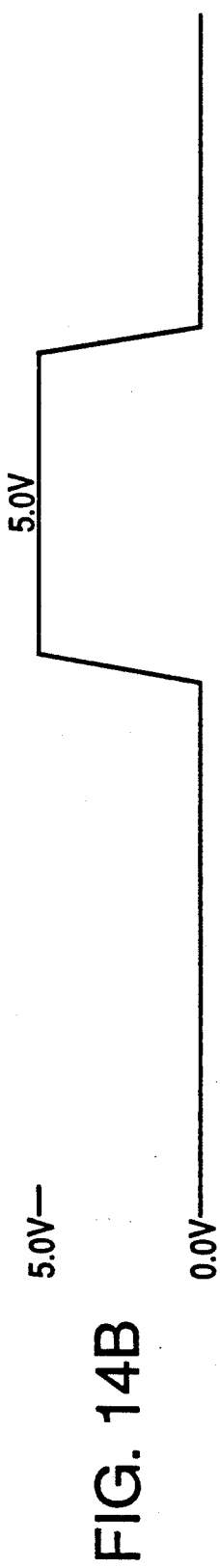
Figure 14C:
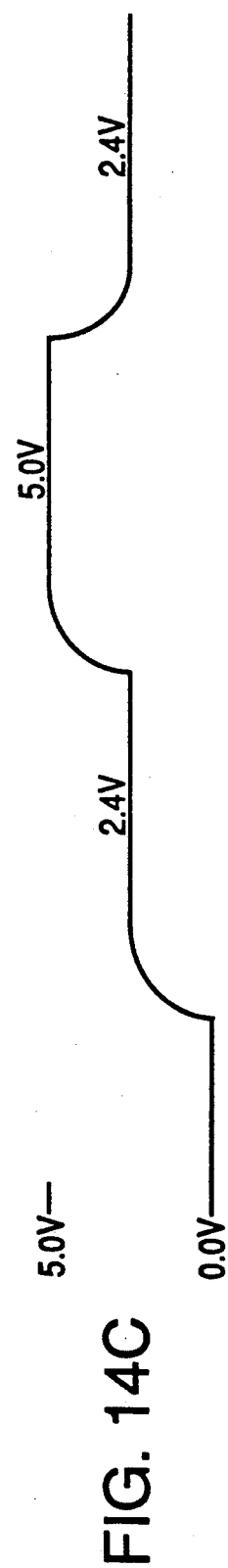

FIG. 14 shows diagrams of examples of input signals and a diagram of the resulting power output signal produced by power stealing circuit 1310 of FIG. 13. FIG. 14A shows a diagram of a TTL level signal on signal input terminal 112a. FIG. 14B shows a diagram of a CMOS level signal on signal input terminal 112b. FIG. 14C shows a diagram of the resulting power output signal on power output terminal 118.

Figure 15:
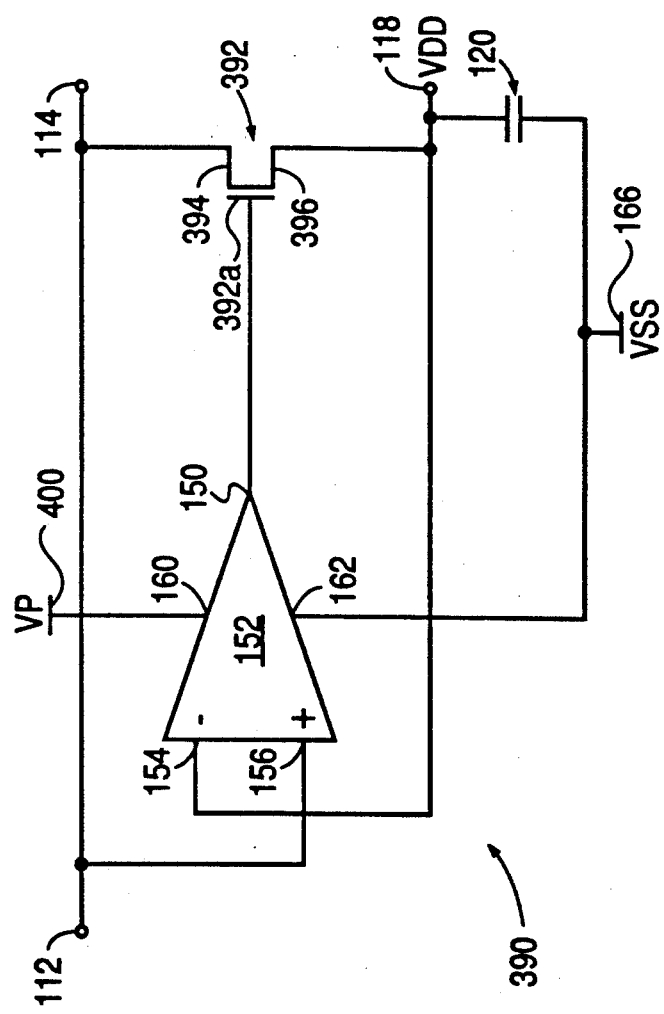
FIGS. 15, 16 and 17 show circuit diagrams of additional power stealing circuits according to this invention.

FIG. 15 shows a circuit diagram of power stealing circuit 390, which is similar to power stealing circuit 140 of FIG. 7. N-channel transistor 392 replaces p-channel transistor 144 of FIG. 7. Signal input terminal 112 is coupled to signal output terminal 114 and to drain 394 of transistor 392. Source 396 of transistor 392 is coupled to power output terminal 118, and gate 392a is coupled to output terminal 150 of comparator 152. Non-inverting input terminal 156 of comparator 152 is coupled to signal input terminal 112, and inverting input terminal 154 is coupled to power output terminal 118. Positive voltage supply terminal 160 of comparator 152 is coupled to positive voltage source 400 providing a voltage VP. Voltage VP is selected to be a value such that it exceeds the maximum possible voltage on signal input terminal 112 by at least the value of the threshold voltage of transistor 392. Negative voltage supply terminal 162 of comparator 152 is coupled to reference terminal 166 providing voltage VSS, typically ground. Reservoir capacitor 120 is coupled between power output terminal 118 and reference terminal 166.

When the voltage on signal input terminal 112 exceeds the voltage on power output terminal 118, output terminal 150 of comparator 152 is at voltage VP. The voltage on gate 392a of transistor 392 exceeds the voltage on source 396 by at least the threshold voltage, so transistor 392 is on. Current flows from signal input terminal 112 through transistor 392 to power output terminal 118 providing a supply voltage and charging reservoir capacitor 120.

When the voltage on signal input terminal 112 is below the voltage on power output terminal 118, the voltage on output terminal 150 of comparator 152 is at the low rail value VSS. Transistor 392 is off, preventing the loss of power from power output terminal 118 to signal input terminal 112. Power stealing circuit 390 may be incorporated into a power stealing circuit (not shown) similar to power stealing circuit 220 of FIG. 8.

The power stealing circuits of FIGS. 5, 6, 7, 8 and 15 provide a positive supply voltage on the power output terminal. Similar power stealing circuits can provide a negative supply voltage on the power output terminal. For example, in power stealing circuit 110 of FIG. 5, if diodes 116 and 122 are "turned around", that is, if the cathode of diode 116 is coupled to signal input terminal 52, the anode is coupled to power output terminal 60, the cathode of diode 122 is coupled to reference terminal 121, and the anode to signal input terminal 52, then power stealing circuit 110 "steals" a negative voltage.

Generally speaking, in a power stealing circuit providing a positive supply voltage, when the signal input terminal is above the power output terminal, the impedance between the signal input terminal and the power output terminal is low, allowing current to flow between the signal input terminal and the power output terminal. When the signal input terminal is below the power output terminal, the impedance is high, blocking the current between the two terminals. In a power stealing circuit providing a negative supply voltage, the situation is reversed: when the signal input terminal is below the power output terminal, the impedance is low; and when the signal input terminal is above the power output terminal, the impedance is high. Thus a power stealing circuit providing a positive supply voltage can be turned into a power stealing circuit providing a negative supply voltage by interchanging the signal input terminal and the power output terminal, that is by providing a data signal on the power output terminal and collecting "stolen" power on the signal input terminal. Some adjustments are made to provide an output signal on the signal output terminal and to improve the circuit performance.

Figure 16:
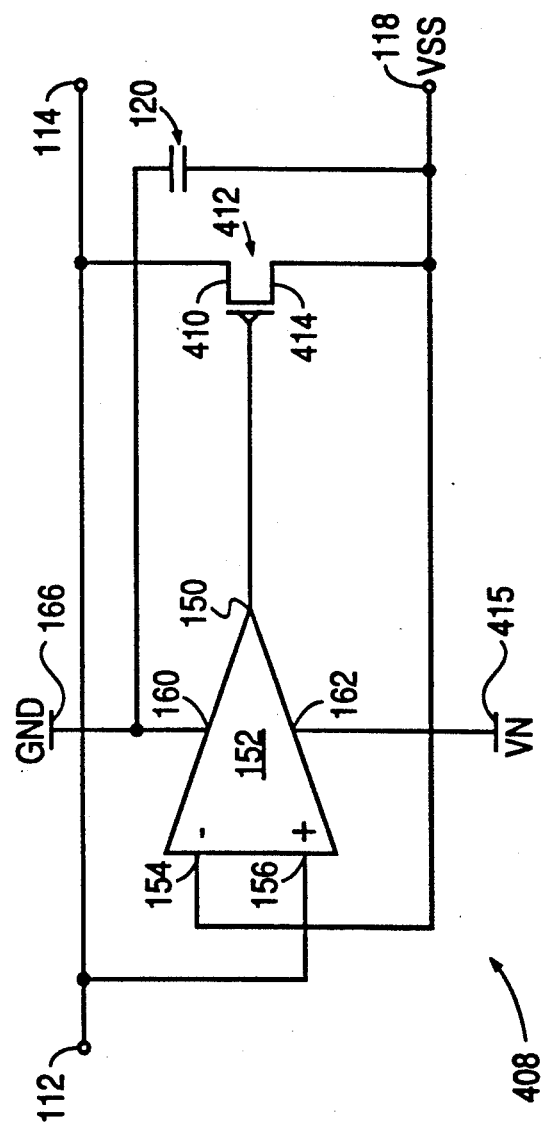

FIG. 16 shows a circuit diagram of power stealing circuit 408 "stealing" a negative voltage. Power stealing circuit 408 is similar to power stealing circuit 140 of FIG. 7. Signal input terminal 112 is coupled to signal output terminal 114 and to drain 410 of p-channel transistor 412. Source 414 of transistor 412 is coupled to power output terminal 118, and the gate is coupled to output terminal 150 of comparator 152. Inverting input terminal 154 of comparator 152 is coupled to power output terminal 118, and non-inverting input terminal 156 is coupled to signal input terminal 112. Positive voltage supply terminal 160 of comparator 152 is coupled to reference terminal 166 providing voltage GND, typically ground. Negative voltage supply terminal 162 is coupled to terminal 415 providing a negative voltage VN. Voltage VN is selected to be a value more negative than the most negative voltage on signal input terminal 112 by at least the value of the threshold voltage of transistor 412. Reservoir capacitor 120 is coupled between power output terminal 118 and reference terminal 166. Power stealing circuit 408 "steals" negative voltage VSS and provides it on power output terminal 118.

Figure 17:
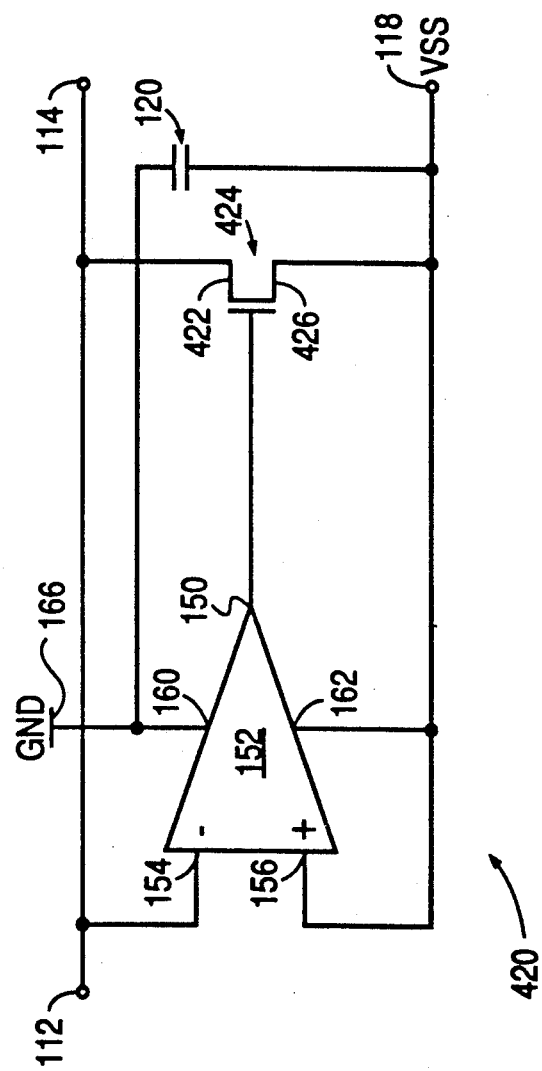

FIG. 17 shows a circuit diagram of power stealing circuit 420 "stealing" a negative voltage. Power stealing circuit 420 is similar to power stealing circuit 390 of FIG. 15. Signal input terminal 112 is coupled to signal output terminal 114 and to source 422 of n-channel transistor 424. Drain 426 of transistor 424 is coupled to power output terminal 118, and the gate is coupled to output terminal 150 of comparator 152. Inverting input terminal 154 of comparator 152 is coupled to signal input terminal 112, and non-inverting input terminal 156 is coupled to power output terminal 118. Positive voltage supply terminal 160 of comparator 152 is coupled to reference terminal 166 providing a voltage GND, typically ground. Negative voltage supply terminal 162 is coupled to power output terminal 118. Reservoir capacitor 120 is coupled between power output terminal 118 and reference terminal 166. Power stealing circuit 420 "steals" negative voltage VSS and provides it on power output terminal 118.

The power stealing circuits of FIGS. 16 and 17 are incorporated, in some embodiments, into power stealing circuits similar to power stealing circuit 220 of FIG. 8.

While the invention has been described with respect to the embodiments set forth above, other embodiments and variations not described herein are within the scope of the invention. In particular, MOSFETs may be replaced by bipolar transistors or other types of transistors in some embodiments. Bipolar transistors may be replaced by other types of transistors. In FIG. 8, transistor 236 acts as a switch between signal input terminal 112 and power output terminal 118, and in some embodiments transistor 236 is replaced by other types of switches. The invention is not limited by the comparator shown in FIG. 11. For example, an operational amplifier or other devices performing a comparator function can be used. Nor is the invention limited by the resistor values and transistor channel parameters. Transistor 260 of FIG. 8 is replaced by a diode in some embodiments. Other embodiments and variations not described herein are within the scope of the invention which is defined by the following claims.

What is claimed is:

1. A power stealing circuit for generating a supply voltage from a source of data signals having a varying potential, said circuit comprising:

a first terminal for receiving said data signals;

a second terminal for providing said supply voltage;

a switch means coupled to said first and second terminals for selectively coupling and uncoupling said first and second terminals; and a comparator having a first input terminal coupled to said first terminal, a second input terminal coupled to said second terminal and an output terminal coupled to said switch means, said comparator being responsive to voltages on said first and second input terminals to control the operation of said switch means.

2. A power stealing circuit as in claim 1, wherein said switch means comprises a transistor having first and second electrodes defining the ends of its main current carrying path and a control electrode whose potential relative to said first electrode determines the conductivity of said transistor, and said power stealing circuit further comprises first means coupling said first electrode to said first terminal, second means coupling said second electrode to said second terminal and third means coupling said control electrode to said output terminal of said comparator.

3. A power stealing circuit as in claim 2, wherein the conductivity of said main current carrying path changes in an inverse relationship with respect to said potential of said control electrode relative to said first electrode;

wherein said first input terminal is an inverting input terminal of said comparator, and said second input terminal is a non-inverting input terminal of said comparator; and wherein said comparator further comprises a positive voltage supply terminal coupled to said second terminal.

4. A power stealing circuit as in claim 1, wherein said switch means comprises a MOS transistor comprised of a substrate of first conductivity type, a well region of second conductivity type extending, for a first predetermined distance, into said substrate from a surface of said substrate, a first region of first conductivity type extending, for a distance less than said first predetermined distance, into said well region from said surface, a second region of first conductivity type extending into said well region from said surface, and a third region of said first conductivity type extending into said substrate from said surface, said third region being proximate to said well region and having a doping concentration higher than a doping concentration of said substrate, and wherein said circuit further includes:

means coupling said well region to said second terminal;

means coupling one of said first and second regions of first conductivity type to said first terminal, means coupling the other of said first and second regions of first conductivity type to said second terminal;
a reference terminal; and
means coupling said third region to said reference terminal.

5. A power stealing circuit as in claim 4, wherein one of said first and second regions at least partially surrounds at least a portion of the other of said first and second regions.

6. A power stealing circuit as in claim 1, further comprising:
a transistor having first and second electrodes defining the ends of its main current carrying path and a control electrode whose potential relative to said second electrode determines the conductivity of said transistor;
first means coupling said first electrode to said first terminal;
second means coupling said second electrode to said second terminal; and
third means coupling said control electrode to said first input terminal.

7. A power stealing circuit as in claim 6, wherein said first means comprises a resistor having a terminal coupled to said first terminal and having another terminal coupled to said first electrode; and
wherein said power stealing circuit comprises a resistor having a terminal coupled to said first terminal and having another terminal coupled to said control electrode and to said first input terminal of said comparator.

8. A power stealing circuit as in claim 1, further comprising means coupled between said first terminal and said switch means, for protecting said circuit from noise on said first terminal.

9. A power stealing circuit as in claim 1, further comprising means coupled in series with said switch means between said first and second terminals, for protecting said circuit from noise on said first terminal.

10. A power stealing circuit as in claim 1, further comprising:
a reference terminal; and
a diode means coupled between said first terminal and said reference terminal, for protecting said circuit from noise on said first terminal.

11. A power stealing circuit as in claim 1 further comprising a reference terminal, wherein said comparator includes:
a first transistor having first and second electrodes defining the ends of its main current carrying path and a control electrode whose potential relative to said first electrode determines the conductivity of said first transistor;
means coupling said first electrode to said second terminal;
first means coupling said second electrode to said reference terminal and to said output terminal; and
means coupling said control electrode to said first terminal.

12. A power stealing circuit as in claim 11, wherein said first means includes:
a second transistor having first and second electrodes defining the ends of its main current carrying path and a control electrode whose potential relative to said first electrode of said second transistor determines the conductivity of said second transistor;
means coupling said second electrode of said second transistor to said second electrode of said first transistor and to said output terminal;
second means coupling said first electrode of said second transistor to said reference terminal; and
means coupling said control electrode of said second transistor to said control electrode of said first transistor.

13. A power stealing circuit as in claim 12, wherein said second means comprises:
a third transistor having first and second electrodes defining the ends of its main current carrying path and a control electrode whose potential relative to said first electrode of said third transistor determines the conductivity of said third transistor;
means coupling said second electrode of said third transistor to said first electrode of said second transistor; and
means coupling said first electrode of said third transistor to said control electrode of said third transistor and to said reference terminal.

14. A power stealing circuit as in claim 1, wherein said comparator has an offset.

15. A power stealing circuit as in claim 1, wherein said comparator further comprises:
a first transistor having first and second electrodes defining the ends of its main current carrying path and a control electrode whose potential relative to said first electrode determines the conductivity of said first transistor;
a second transistor having first and second electrodes defining the ends of its main current carrying path and a control electrode whose potential relative to said first electrode of said second transistor determines the conductivity of said second transistor;
a third transistor having first and second electrodes defining the ends of its main current carrying path and a control electrode whose potential relative to said first electrode of said third transistor determines the conductivity of said third transistor;
means coupling said control electrode of said first transistor to said first input terminal;
means coupling said control electrode of said second transistor to said second input terminal;
means coupling said second electrodes of said first and second transistors to said second terminal;
means coupling said first electrode of said third transistor to said second terminal;
means coupling said second electrode of said second transistor to said control electrode of said third transistor;
first means for providing an approximately constant current;
means coupling said first electrodes of said first and second transistors to said first current providing means;
second means for providing an approximately constant current; and
means coupling said second electrode of said third transistor to said second current providing means and to said output terminal.

16. A power stealing circuit as in claim 1 further comprising a reference terminal, wherein said comparator comprises:
a first transistor having first and second electrodes defining the ends of its main current carrying path and a control electrode whose potential relative to said first electrode determines the conductivity of said first transistor;

a second transistor having first and second electrodes defining the ends of its main current carrying path and a control electrode whose potential relative to said first electrode of said second transistor determines the conductivity of said second transistor;

means coupling said control electrode of said first transistor to said first input terminal;

means coupling said control electrode of said second transistor to said second input terminal;

means coupling said second electrodes of said first and second transistors to said second terminal;

means coupling the second electrode of one of said first and second transistors to said output terminal;

a third transistor having first and second electrodes defining the ends of its main current carrying path and a control electrode whose potential relative to said first electrode of said third transistor determines the conductivity of said third transistor;

means coupling said second electrode of said third transistor to said first electrodes of said first and second transistors; and means coupling said first electrode of said third transistor to said reference terminal; and wherein said power stealing circuit further comprises:

a first resistor coupled between said second terminal and said reference terminal and having a first temperature coefficient;

a second resistor coupled between said second terminal and said reference terminal in series with said first resistor and having a second temperature coefficient different from said first temperature coefficient;

first means coupled between said second terminal and said reference terminal in series with said first and second resistors, there being a first voltage V1 across said first means and a first current through said first means;

second means coupled between said second terminal and said reference terminal in parallel with said first means and said first and second resistors, there being a second voltage V2 across said second means and a second current through said second means, said second current being about equal to said first current, a difference V2-V1 having a temperature coefficient about equal to a combined temperature coefficient of said first and second resistors;

a fourth transistor having first and second electrodes defining the ends of its main current carrying path and a control electrode whose potential relative tro said first electrode of said fourth transistor determines the conductivity of said fourth transistor;

means for making a current through said fourth transistor about equal to said first current;

means coupling said first electrode of said third transistor to said first electrode of said fourth transistor; and means coupling said control electrode of said third transistor to said control electrode of said fourth transistor.

17. A power stealing circuit for generating a supply voltage from a plurality of sources of data signals having a varying potential, said power stealing circuit comprising:

a plurality of first terminals, each first terminal for receiving data signals from one of said sources;

a second terminal for providing said supply voltage;

a reference terminal;

a plurality of switch means, each switch means coupled to one of said first terminals and to said second terminal, each switch means selectively coupling and uncoupling its respective first terminal and said second terminal;

a plurality of comparators, each comparator having a first input terminal coupled to one of said first terminals, a second input terminal coupled to said second terminal and an output terminal coupled to the switch means coupled to the first terminal to which the first input terminal is coupled, each comparator being responsive to voltages on its first and second input terminals to control the operation of the respective switch means;

wherein each comparator comprises:

a first transistor having first and second electrodes defining the ends of its main current carrying path and a control electrode whose potential relative to said first electrode determines the conductivity of said first transistor;

a second transistor having first and second electrodes defining the ends of its main current carrying path and a control electrode whose potential relative to said first electrode of said second transistor determines the conductivity of said second transistor;

means coupling said control electrode of said first transistor to the first input terminal of the comparator;

means coupling said control electrode of said second transistor to the second input terminal of the comparator;

means coupling said second electrodes of said first and second transistors to said second terminal;

means coupling the second electrode of one of said first and second transistors to the output terminal of said comparator;

a third transistor having first and second electrodes defining the ends of its main current carrying path and a control electrode whose potential relative to said first electrode of said third transistor determines the conductivity of said third transistor;

means coupling said second electrode of said third transistor to said first electrodes of said first and second transistors; and means coupling said first electrode of said third transistor to said reference terminal; and wherein said power stealing circuit further comprises:

a first resistor coupled between said second terminal and said reference terminal and having a first temperature coefficient;

a second resistor coupled between said second terminal and said reference terminal in series with said first resistor and having a second temperature coefficient different from said first temperature coefficient;

first means coupled between said second terminal and said reference terminal in series with said first and second resistors, there being a first voltage V1 across said first means and a first current through said first means;

second means coupled between said second terminal and said reference terminal in parallel with said first means and said first and second resistors, there being a second voltage V2 across said second means and a second current through said second means, said second current being about equal to said first current, a difference V2-V1 having a temperature coefficient about equal to a combined temperature coefficient of said first and second resistors;

a fourth transistor having first and second electrodes defining the ends of its main current carrying path and a control electrode whose potential relative to said first electrode of said fourth transistor determines the conductivity of said fourth transistor;

means for making a current through said fourth transistor about equal to said first current;

means coupling the first electrodes of the third transistors of said comparators to said first electrode of said fourth transistor; and means coupling the control electrodes of the third transistors of said comparators to said control electrode of said fourth transistor.

18. A power stealing circuit as in claim 1 further comprising:

a reference terminal; and means coupled to said second terminal and said reference terminal, for storing an electrical charge at said second terminal.

19. A power stealing circuit as in claim 1 further comprising a diode having two terminals, means connecting one terminal of said diode to said first terminal, and means connecting the other terminal of said diode to said second terminal.

* * * * *